United States Patent
Houdeau et al.

[19]

[11] Patent Number: 6,095,423
[45] Date of Patent: Aug. 1, 2000

[54] METHOD OF PRODUCING A SMART CARD MODULE, A SMART CARD MODULE PRODUCED BY THE METHOD, AND A COMBINATION SMART CARD CONTAINING THE SMART CARD MODULE

[75] Inventors: Detlef Houdeau, Langquaid; Robert Wilm, Kasseburg, both of Germany

[73] Assignee: Siemens Aktiengesellschaft, Munich, Germany

[21] Appl. No.: 09/250,874

[22] Filed: Feb. 16, 1999

Related U.S. Application Data

[63] Continuation of application No. PCT/EP97/04378, Aug. 12, 1997.

[30] Foreign Application Priority Data

Aug. 14, 1996 [DE] Germany ............... 196 32 813

[51] Int. Cl.⁷ .................................................. G06K 19/00
[52] U.S. Cl. ........................ 235/487; 235/492; 361/737; 257/679
[58] Field of Search .................................. 235/487, 488, 235/492, 441; 361/737, 820; 257/679

[56] References Cited

U.S. PATENT DOCUMENTS

| | | | |
|---|---|---|---|
| 4,649,418 | 3/1987 | Uden | 235/487 |
| 5,027,190 | 6/1991 | Haghiri-Tehrani et al. | 235/492 |
| 5,424,527 | 6/1995 | Takahira | 235/492 |
| 5,550,709 | 8/1996 | Iwasaki | 361/737 |
| 5,585,618 | 12/1996 | Droz | 235/492 |
| 5,612,532 | 3/1997 | Iwasaki | 235/492 |

FOREIGN PATENT DOCUMENTS

| | | |
|---|---|---|
| 0671705A2 | 9/1995 | European Pat. Off. . |
| 0682321A2 | 11/1995 | European Pat. Off. . |
| 3924439A1 | 4/1991 | Germany . |
| 4443980A1 | 6/1996 | Germany . |
| 19500925A1 | 7/1996 | Germany . |

*Primary Examiner*—Thien M. Le
*Assistant Examiner*—Daniel St. Cyr
*Attorney, Agent, or Firm*—Herbert L. Lerner; Laurence A. Greenberg; Werner H. Stemer

[57] ABSTRACT

The smart card module has a supporting plate which has a first contact plane and a semiconductor chip and electrically conductive connections between the semiconductor chip and the first contact plane. Apart from the first contact plane, the smart card module has, on the reverse side of the supporting plate, another connection plane that is also electrically connected to the semiconductor chip. The other connection plane may be used, for example, for turning on a built-in induction coil inside the chip body for contactless data transfer. The invention relates also to a combined smart card for contacting and contactless data transfer, which contains the smart card module. A manufacturing process is specified with a given sequence of process steps leading to the production of the smart card module.

16 Claims, 2 Drawing Sheets

METHOD OF PRODUCING A SMART CARD MODULE, A SMART CARD MODULE PRODUCED BY THE METHOD, AND A COMBINATION SMART CARD CONTAINING THE SMART CARD MODULE

CROSS-REFERENCE TO RELATED APPLICATION

This is a continuation of copending International Application PCT/EP97/04378, filed Aug. 12, 1997, which designated the United States.

BACKGROUND OF THE INVENTION

Field of the Invention

The invention relates to a method of producing a smart card module, a smart card module produced by the method, and a combination smart card containing the smart card module.

A combination smart card (or combination card, for short) is to be understood below as a smart card in which data and information can be exchanged with a card read/write unit both in a conventional way by tapping electric contacts and in an inductive way without contacts.

Such combination cards can be used, for example, as a small change purse or for monitoring personal access with attendant means of registration.

For the purpose of conventional data transmission, smart cards have exposed contacts on a card surface which usually correspond to the ISO Standard 7810 or 7816 and which are read by means of electric lifting contacts. The contact surfaces for conventional data transmission are denoted below in general as first contact plane or, in a simplified fashion, as ISO contact surfaces. A chip module for such a conventional smart card is described, for example in German patent application DE A 39 24 439.

For the purpose of data transmission in an inductive way, an antenna is integrated into the smart card. Usually, an electric coil is arranged in the smart card body such that it cannot be seen from the outside. Coils with a carrier frequency in an open industrial band, for example 13.56 MHz, are suitably used in this context.

The invention is described below with reference to the example of an electric coil, but without being limited to that special implementation of an antenna. The smart card (SC) module produced by using the method according to the invention is, moreover, also basically suitable for making contact with other elements of a smart card with which contact is to be made.

If the two data transmission systems described above are to be combined in a smart card, it is necessary to create electrically conductive connections from the semiconductor chip both to the ISO contacts and to the coil.

The ISO contacts are produced, as a rule, in such a way that firstly a smart card module is produced which is then inserted (implanted) in a cutout in the card substrate. The smart card module comprises a flexible substrate material, for example a glass fiber reinforced epoxy film on one side of which the semiconductor chip is disposed, and on the other side of which the ISO contact surfaces are formed. The latter generally comprise a copper layer with a surface finish comprising a nickel layer and a gold layer. The ISO contact surfaces and the semiconductor chip are connected in a conducting fashion to bond wires through cutouts in the module substrate film.

It would be conceivable in theory for the contacts required to make electrical contact with the coil to be placed on the ISO contact surfaces, that is to say to widen the ISO contact surfaces by two additional fields.

However, such an arrangement would have the disadvantage that the connecting sites would come to lie on the surface of the smart card and be susceptible thereby to interference effects and tampering. For example, shifts in the natural frequency can result from the contact surfaces and/or physical contacts touching metal objects and short circuits thereby triggered. The result would be malfunctions or complete functional failure. In order to exclude such disturbances to and tampering of the information to be transmitted inductively, there was therefore a need to find other ways of making contact between the semiconductor chip and the coil.

German patent application DE A 195 00 925 describes a smart card for both contactless and conventional data transmission. There, the chip module incorporated in the card body has two mutually opposite connecting planes for conventional data exchange and/or for connecting an antenna.

Moreover, DE A 195 00 925 describes methods which can be used to incorporate such a chip module in the card body and form the required contacts.

The methods used to date for producing smart card modules include numerous process steps such as, for example, the separate structuring of one or more connecting planes (for example by etching) and/or of the module substrate ribbon (by punching or drilling) and are therefore time-consuming and expensive.

SUMMARY OF THE INVENTION

It is accordingly an object of the invention to provide a smart card (SC) module, which overcomes the above-mentioned disadvantages of the heretofore-known devices and methods of this general type and which permits an antenna (induction coil) or other components of a smart card with which contact is to be made to be connected in a simple and cost-effective way. The aim is to produce a SC module with the method which largely excludes the influence of interference or tampering on the connections. Moreover, the method according to the invention is to lead to a SC module which can be implanted in a card body using conventional methods.

With the foregoing and other objects in view there is provided, in accordance with the invention, a method of producing a smart card module having a substrate with a first contact plane, a semiconductor chip, and a further connecting plane, the method which comprises:

- laminating a metal strip along a longitudinal direction onto a first side of a module substrate ribbon;
- structuring the metal strip to form individual connecting sites of a further connecting plane and simultaneously structuring the module substrate ribbon (e.g. forming a cavity for receiving a semiconductor chip and/or openings for electrically conductive connections);
- subsequently laminating a metal foil onto a second side of the module substrate ribbon, and structuring the metal foil to form a first contact plane;
- mounting a semiconductor chip in the module substrate ribbon and contacting the chip with the first contact plane and the further connecting plane;
- encasing the semiconductor chip with plastic; and
- singling an individual smart card module from the module substrate ribbon.

In other words, an SC module is produced with the novel method which comprises a substrate and, arranged thereupon, a first contact plane (ISO contact surfaces) and a semiconductor chip. The SC module can be designed in a conventional way. For example, the substrate can be a plastic film, in particular a glass fiber reinforced epoxy film, which has cutouts for the semiconductor chip and for the bond wires by means of which the semiconductor chip is connected to the first contact plane (ISO contact surfaces). The ISO contact surfaces can consist of a copper layer which is coated with layers of nickel and gold. The contact surfaces usually correspond to the ISO Standard 7810 or 7816.

The SC module produced using the method according to the invention has a further connecting plane, which is arranged on the side of the module substrate opposite the first contact plane. The additional connecting plane therefore lies as a rule on the same side of the substrate as the semiconductor chip. The further connecting plane expediently consists of metal. In order to provide it with the same bondability as the first contact plane, it is preferably designed exactly like the latter. For example, it comprises a copper layer which is coated with layers of nickel and gold. The further connecting plane is structured so as to create the required number of connecting sites to the induction coil or other components of a smart card with which contact is to be made.

The structuring of the further connecting plane is preferably performed by punching or the like. Using the method according to the invention, it is performed simultaneously with the punching of the cutout for the semiconductor chip, the openings for the bond wires and, if appropriate, the transport openings into the module substrate. The production of the further connecting plane can be greatly simplified in this way.

The further connecting plane, or at least the base layer thereof, is thus applied to the module substrate before it is structured. If the further connecting plane comprises a layer sequence of Cu—Ni—Au, the first step, for example, is to laminate a copper strip onto a side of the module substrate, preferably in the middle. Thereafter, the module substrate is structured by punching or the like. Subsequently, the nickel or gold layer is mounted by electroplating. It is preferred, in particular, to electroplate at the same time as electroplating the ISO contact surfaces (the first contact plane), which are located on the other side of the module substrate. Subsequently, the semiconductor chip is fastened on the SC module in a conventional manner. The electrically conducting connections with the first contact plane (the ISO contact surfaces) and the additional connecting sites of the further connecting plane are then produced in the usual way, for example by using bond wires made from gold.

In accordance with an added feature of the invention, the first contact plane and/or the further connecting plane are electroplated.

In accordance with an additional feature of the invention, a support ring may be fitted on the further connecting plane, and the metal strip is laminated substantially centrally in the middle on the first side of the module substrate ribbon.

In accordance with another feature of the invention, the support ring may be bonded onto the further connecting plane with a pressure-sensitive adhesive.

The optional ring is to protect the semiconductor chip. It expediently serves simultaneously as a lateral boundary for the plastic covering the chip, i.e. as a lateral mold. The support ring preferably consists of a resilient material, for example of metal and, in particular, of copper. In order to avoid short circuits between the support ring and the further connecting plane, it is expedient to arrange a dielectric between the two of them. The dielectric can, for example, be the adhesive with which the support ring is fastened on the module. A pressure-sensitive adhesive is preferably used.

The SC module (with or without support ring) produced using the method according to the invention can be implanted in a way known per se in the card body of the smart card by using conventional methods. For example, a cavity whose shape and size corresponds to the SC module to be implanted is milled into the card body, usually a plastic film, for example made from polycarbonate. The SC module is bonded into said cavity, normally by using a hot-melt adhesive (so-called hot-melt method).

There is therefore also provided, in accordance with the invention, a smart card module produced by the above-described method, wherein the further connecting plane consists of metal, and preferably copper.

In accordance with a further feature of the invention, the copper is electroplated with nickel, and the nickel is electroplated with gold.

In accordance with again another feature of the invention, the further connecting plane is formed with two connecting sites for connecting an antenna, such as an induction coil for inductive data communication between the semiconductor chip and an external read/write device.

In accordance with again a further feature of the invention, the ring surrounding the semiconductor chip is made from a resilient material, i.e. from metal. It is preferably formed of copper.

In accordance with a concomitant feature of the invention, there is provided a combination smart card for contactless and conventional data transmission, which comprises a card body and a smart card module as described above in the card body.

It is particularly preferred when the antenna (induction coil) which is to be connected to the additional connecting plane of the SC module is integrated in the card substrate or arranged on the latter. If the induction coil is a coil made from copper wire which is embedded in the card body such that it cannot be seen from the outside, the connecting sites are exposed, for example by milling the card body surface, before implantation of the SC module. It is particularly preferred for the exposure of the connecting sites to be performed simultaneously with milling of the cavity for the SC module.

The electrically conducting connections between the further connection plane of the SC module and the connections of the induction coil are produced either by applying soft solder or with the aid of an anisotropically conducting adhesive.

Other features which are considered as characteristic for the invention are set forth in the appended claims.

Although the invention is illustrated and described herein as embodied in a method for producing a smart card module, a smart card module produced using said method, and a combination smart card containing said smart card module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
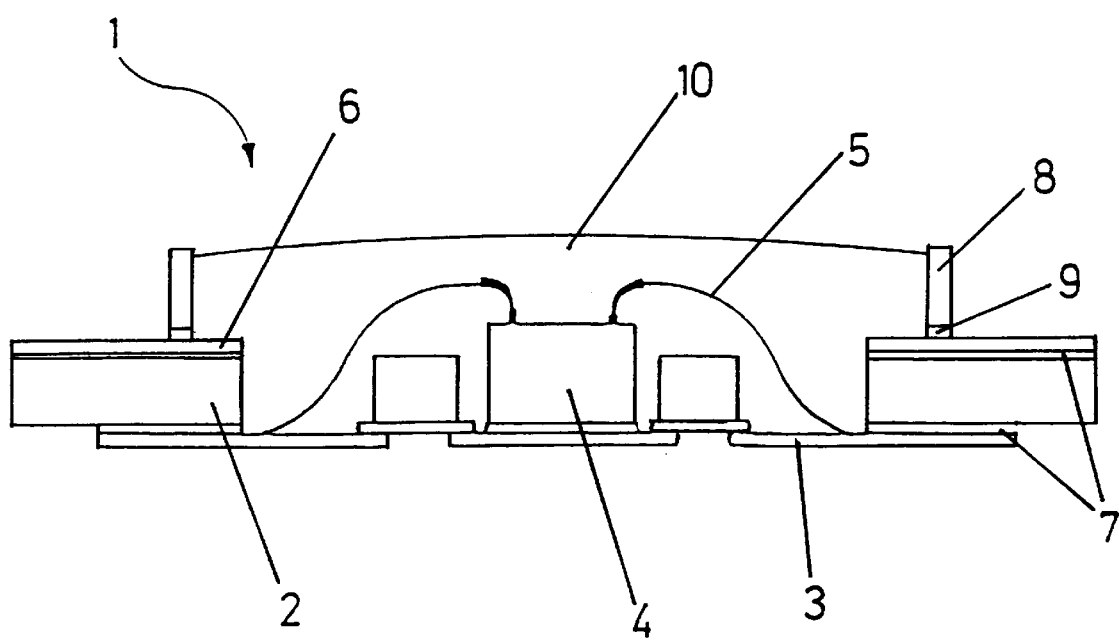
FIG. 1 is a diagrammatic side elevational of a vertical section through an SC module produced with the method according to the invention.

Referring now to the figures of the drawing in detail and first, particularly, to FIG. 1 thereof, there is seen an exemplary SC module 1 produced in accordance with the novel method. The SC module 1 has a module substrate 2 which can, for example, comprise a plastic film such as glass fiber reinforced epoxy film. A first contact plane 3 is laminated on the underside of the substrate 2 by means of an adhesive 7. The first contact plane usually consists of contact surfaces that correspond to ISO Standard 7810 or 7816. The contact surfaces themselves may, for example, comprise a copper foil coated with layers of nickel and gold.

According to the invention, there is arranged on the side of the substrate 2 opposite the first contact plane 3 a further connecting plane 6 which consists, for example, of metal and, in particular, of a nickel and gold-coated copper foil laminated with adhesive 7. The further connecting plane comprises a right-hand and a left-hand connecting site.

A semiconductor chip is disposed in a cutout in the substrate 2. The semiconductor chip 4 is connected in an electrically conducting fashion to the first contact plane 3 and the further connecting plane 6. Only the connections 5 to the first contact plane 3, which are produced with bond wires, for example of gold, and are led through further openings in the substrate 2 are shown in the present case. The non-illustrated connections of the semiconductor chip and further connecting planes 6 (i.e. right-hand and left-hand connecting sites) can be obtained in the same way as for the first contact plane 3, that is to say likewise with bond wires, for example.

A support ring 8 surrounds the semiconductor chip 4. The support ring 8 is fitted on the further connecting plane 6 in order to protect the semiconductor chip 4. The support ring 8 expediently consists of a resilient material and, in particular, of metal, for example of copper. In order to prevent short circuits between the connecting sites of the further connecting plane 6 and the support ring 8, a dielectric 9 is inserted between the further connecting plane and the support ring 8. The support ring 8 is preferably bonded, i.e. glued on. The adhesive expediently serves as the dielectric in this case. It is particularly preferred to use a pressure-sensitive adhesive.

The support ring 8 can simultaneously also serve as a lateral boundary for a plastic molding compound 10, for example silicone varnish or epoxy resin, with which the semiconductor chip 4 is covered.

The SC module 1 is produced with the aid of the method according to the invention, which comprises the following steps:

laminating a metal strip in the longitudinal direction onto a first side of a module substrate ribbon as a further connecting plane (6);

structuring the metal strip to form individual connecting sites of the further connecting plane (6);

laminating a metal foil onto the other side of the module substrate ribbon and structuring the first contact plane (3);

structuring the module substrate ribbon by introducing openings for the semiconductor chip (4) and/or for the electrically conductive connections (5);

if appropriate, electroplating the first contact plane (3) and/or the further connecting plane (6);

if appropriate, fitting a support ring (8) on the further connecting plane (6);

mounting the semiconductor chip (4) and making contact (5) with a first contact plane (3) and a further connecting plane (6);

encasing the semiconductor chip (4) with plastic; and singling the smart card module (1) by separating it from the other modules (1) produced in the process.

The above steps need not all be carried out in the sequence specified. In the method according to the invention, however, it is provided that the lamination of the metal strip for the further connecting plane and the structuring thereof to form individual connecting sites are performed before the lamination and structuring of the first contact plane, and that the structuring of the further connecting plane is performed jointly with the structuring of the module substrate ribbon.

The first step here is thus for a copper strip, which can have a width of 200 µm up to 1 mm, for example, to be laminated onto the module substrate ribbon, essentially in the middle and in the longitudinal direction.

The expression "module substrate ribbon" refers in this connection to a substrate film for a series of successive module units. In the case of an arrangement of the metal strip essentially in the middle, the strip is also located essentially in the middle region of the finished module, as well. However, this definition also includes substrate films of greater width on which, for example, a plurality of rows of module units are accommodated parallel to one another. In such a case, one metal strip is laminated per module row. After the metal strip has been applied, it is structured in a subsequent step so that individual connecting sites are obtained. The structuring can expediently be performed by punching separating surfaces into the metal ribbon. The structuring is performed simultaneously with the structuring of the module substrate 2. By punching in the cutouts for the semiconductor chip 4, the openings for the bond wires 5 for making contact between the semiconductor chip and the first contact plane and for the transport openings, separating surfaces, and thus isolated connecting sites, are simultaneously produced in the further connecting plane.

The first contact plane is applied in a conventional process, specifically after lamination of the further connecting plane, that is to say after lamination of the copper layer in the case of a Cu—Ni—Au metalization layer.

In order to achieve an identical bondability of the first and second contact planes, the further connecting plane can also be provided with a finished surface, for example by electroplating with nickel and gold. It is expedient for the electroplating to be performed after the structuring and, in particular, in common with the electroplating of the first contact plane.

Subsequently, a support ring 8 can further be applied for the purpose of protecting the semiconductor chip, expediently by being bonded with a pressure-sensitive adhesive 9.

The semiconductor chip 4 is encased with plastic 10 in the usual way. The support ring 8 can thereby serve as a lateral boundary of the potting compound.

As noted above, the invention further relates to a combined card for contactless and conventional (galvanic contact) data transmission, which comprises a SC module 1 produced using the method according to the invention.

The SC module produced using the method according to the invention has the advantage that it can be implanted in the card body not only by using conventional method steps, but also in the usual way.

Thus, a cavity whose shape and size are matched to the SC module to be implanted is made in a known way in the card body. The card body is usually a plastic film of polycarbonate. The SC module can be implanted by using the widespread hot-melt method. To produce the electrically conducting connection between the connecting sites of the further connecting plane 6 of the SC module 1, and an antenna integrated into the card body, for example a sunken copper wire coil, or in general a means for contactless data transmission, the procedure is such that connecting sites are exposed in the cavity which is intended to hold the SC modules. It is particularly preferred for the connecting sites to be exposed simultaneously with the milling of the cavity. For this purpose, the cavity can, for example, have a step-shaped profile, as is indicated in FIGS. 2 and 3.

Figure 2:
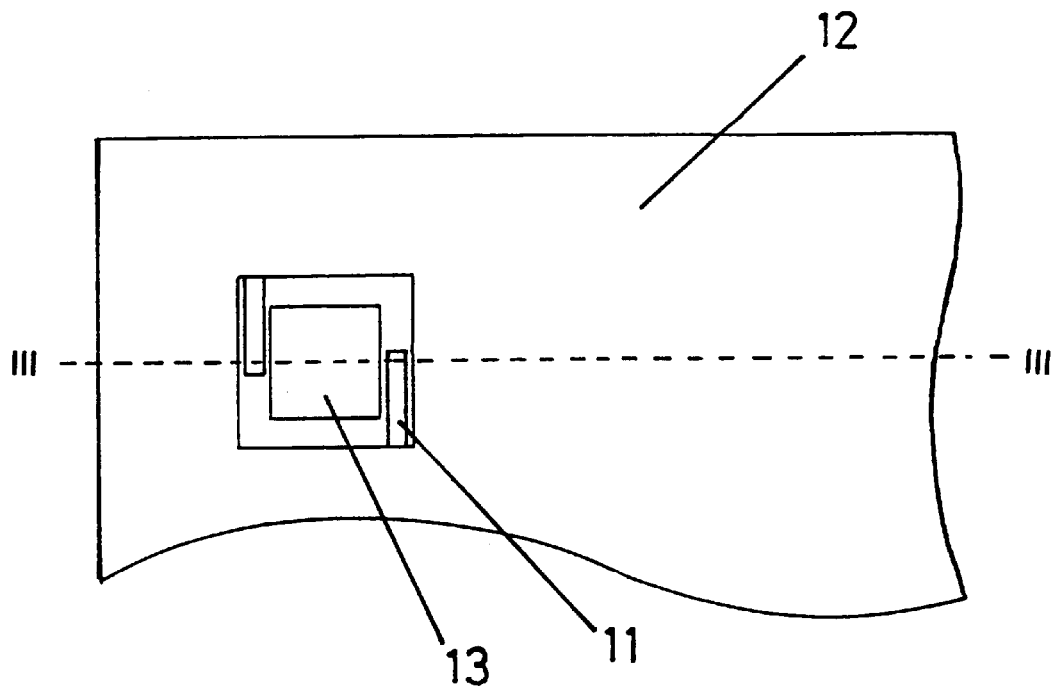
FIG. 2 is a partial diagrammatic plan view of a card body for holding the SC module produced by the novel method.
Figure 3:
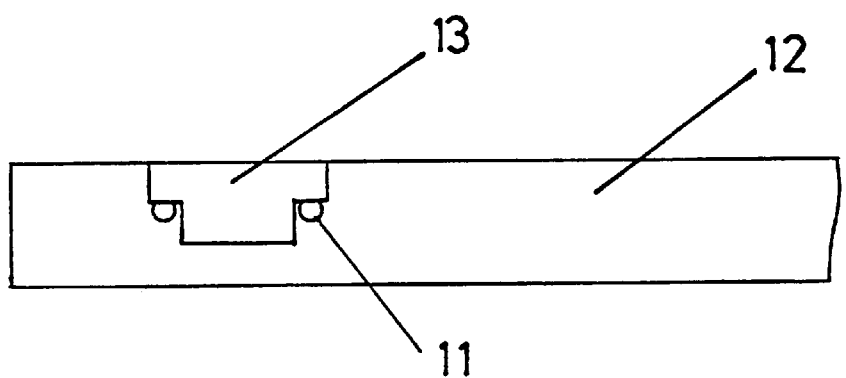
FIG. 3 is a partial diagrammatic sectional view through the card body taken along the line III—III in FIG. 2.

With reference to FIG. 2, there is shown a card body 12 with a cavity 13 in which two connecting sites of the antenna 11 are exposed. FIG. 3 illustrates a section along the line III—III in FIG. 2, in which the step-shaped profile of the cavity 13 may be seen. During implantation, the first contact plane 3 of the SC module comes to lie at the top, and the connecting sites of the further connecting plane 6 rest on the connecting sites of the antenna 11 which have been milled free.

The electrically conducting connection in this region comes about, for example, by virtue of the fact that soft solder or an anisotropically conducting adhesive is applied in the region of the connecting sites. In order to be capable of use in the hot-melt method, the soft solder expediently has a softening point in the neighborhood of approximately 110° C.

In addition to a first contact plane (ISO contact surfaces), the SC module produced using the method according to the invention has a further connecting plane, which secures against interference and tampering from outside. The SC module can be implanted in a card body by using current methods, with the result that it is also possible to produce smart cards in a simple and cost-effective way.

We claim:

1. A method of producing a smart card module having a substrate with a first contact plane, a semiconductor chip, and a further connecting plane, the method which comprises:

laminating a metal strip along a longitudinal direction onto a first side of a module substrate ribbon;

structuring the metal strip to form individual connecting sites of a further connecting plane and simultaneously structuring the module substrate ribbon by punching the module substrate ribbon for forming a cavity for receiving a semiconductor chip and openings for electrically conductive connections in the module substrate ribbon;

subsequently laminating a metal foil onto a second side of the module substrate ribbon, and structuring the metal foil to form a first contact plane electrically isolated from the further connecting plane;

mounting the semiconductor chip in the module substrate ribbon and contacting the chip with the first contact plane and the further connecting plane;

encasing the semiconductor chip with a plastic compound; and singling an individual smart card module from the module substrate ribbon.

2. The method according to claim 1, which further comprises electroplating at least one of the first contact plane and the further connecting plane.

3. The method according to claim 1, which further comprises simultaneously electroplating the first contact plane and the further connecting plane.

4. The method according to claim 1, which further comprises fitting a support ring on the further connecting plane.

5. The method according to claim 1, wherein the step of laminating the metal strip comprises laminating the metal strip substantially centrally on the first side of the module substrate ribbon.

6. The method according to claim 1, which further comprises bonding a support ring onto the further connecting plane with a pressure-sensitive adhesive.

7. A smart card module produced by the method of claim 1, wherein the further connecting plane consists of metal.

8. The smart card according to claim 7, wherein the metal is copper.

9. The smart card module according to claim 8, wherein the copper is electroplated with nickel, and the nickel is electroplated with gold.

10. The smart card module according to claim 7, wherein the further connecting plane is formed with two connecting sites for connecting an antenna.

11. The smart card module according to claim 7, wherein the further connecting plane is formed with two connecting sites for connecting an induction coil for inductive data communication with the semiconductor chip.

12. The smart card module according to claim 7, wherein the first contact plane is formed by ISO contact surfaces.

13. The smart card module according to claim 7, which comprises a support ring made from a resilient material surrounding the semiconductor chip.

14. The smart card module according to claim 13, wherein the support ring is a metal ring.

15. The smart card module according to claim 13, wherein the support ring is a copper ring.

16. A combination smart card for contactless and conventional data transmission, which comprises a card body and a smart card module according to claim 7 disposed in said card body.

* * * * *